United States Patent [19]

Bernius et al.

[11] Patent Number: 4,663,944

[45] Date of Patent: May 12, 1987

[54] CRYOGENIC SAMPLE STAGE FOR AN ION MICROSCOPE

[75] Inventors: Mark T. Bernius; George H. Morrison, both of Ithaca, N.Y.

[73] Assignee: Cornell Research Foundation, Inc., Ithaca, N.Y.

[21] Appl. No.: 754,111

[22] Filed: Jul. 12, 1985

[51] Int. Cl.⁴ ............................................. F25B 19/00
[52] U.S. Cl. ............................. 62/514 R; 250/442.1; 250/443.1
[58] Field of Search ................ 62/62, 78, 320, 514 R; 250/309, 443.1, 442.1

[56] References Cited

U.S. PATENT DOCUMENTS

| | | | |
|---|---|---|---|
| 3,079,504 | 2/1963 | Hutchens | 62/62 |
| 3,244,877 | 4/1966 | Herrmann et al. | 250/443.1 |
| 3,444,365 | 5/1969 | Loebe | 250/443.1 |
| 3,462,969 | 8/1969 | Grasenick et al. | 62/320 |
| 3,521,056 | 7/1970 | Suzuki | 250/442.1 |
| 3,593,537 | 7/1971 | Stuart et al. | 62/62 |
| 3,978,686 | 9/1976 | Lechner et al. | 62/62 |
| 4,408,464 | 10/1983 | Salour et al. | 62/514 R |
| 4,425,507 | 1/1984 | Panov et al. | 250/514 R |
| 4,495,782 | 1/1985 | Salour et al. | 62/514 R |
| 4,514,636 | 4/1985 | King | 250/443.1 |

*Primary Examiner*—Ronald C. Capossela
*Attorney, Agent, or Firm*—Sughrue, Mion, Zinn, Macpeak, and Seas

[57] ABSTRACT

A cryogenic sample stage for an ion mass spectrometry system. A mounting is adjustable relative to the ion microscope lens system to maintain alignment with the immersion lens. Sample temperatures below −150° C. are maintained by circulating cooling fluid to the mounting section thereby allowing a direct analysis of frozen-hydrated biological samples.

14 Claims, 7 Drawing Figures

U.S. Patent  May 12, 1987  Sheet 1 of 4  4,663,944
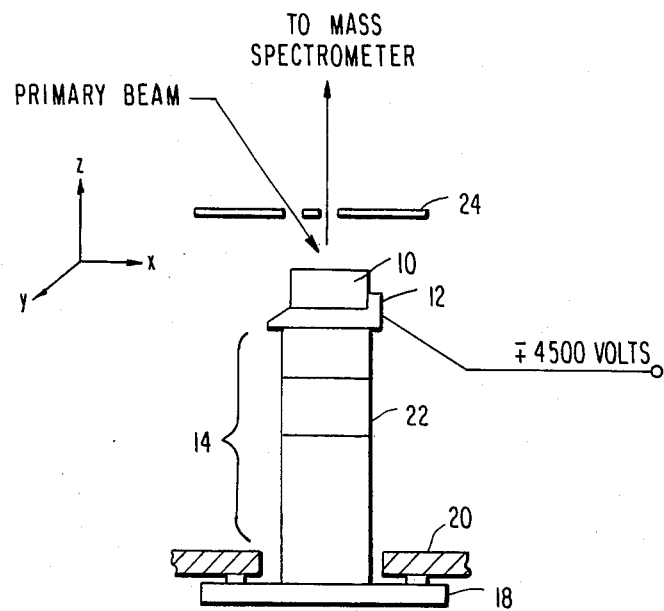
FIG.1  PRIOR ART
FIG.2
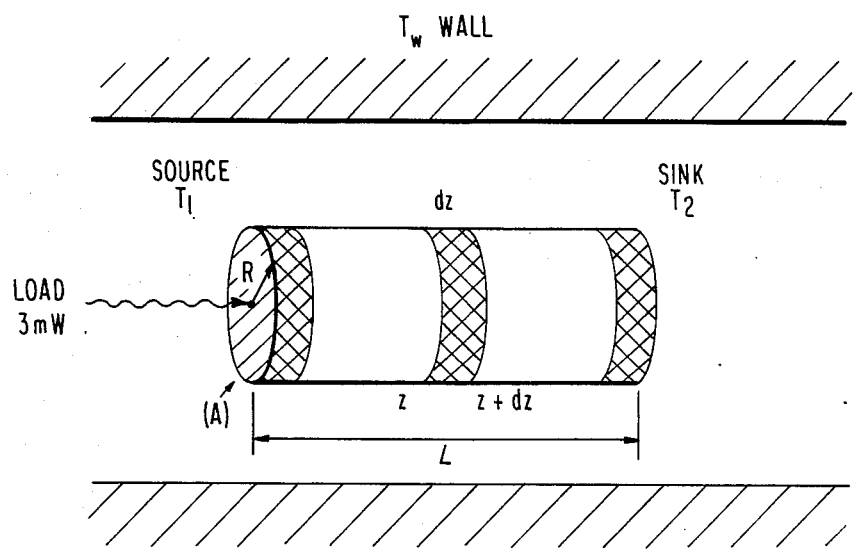

FIG. 5 — COOL DOWN CURVES

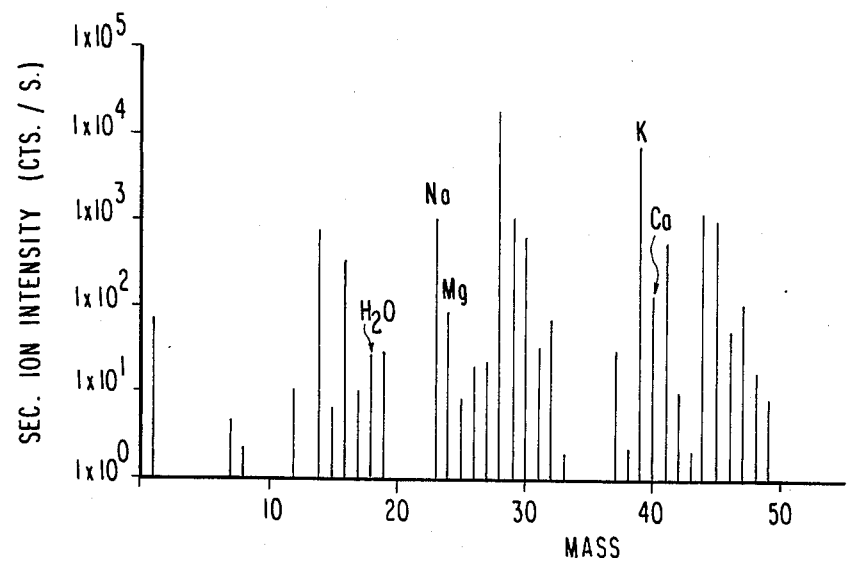
FIG. 6 — FROZEN HYDRATED SECTION
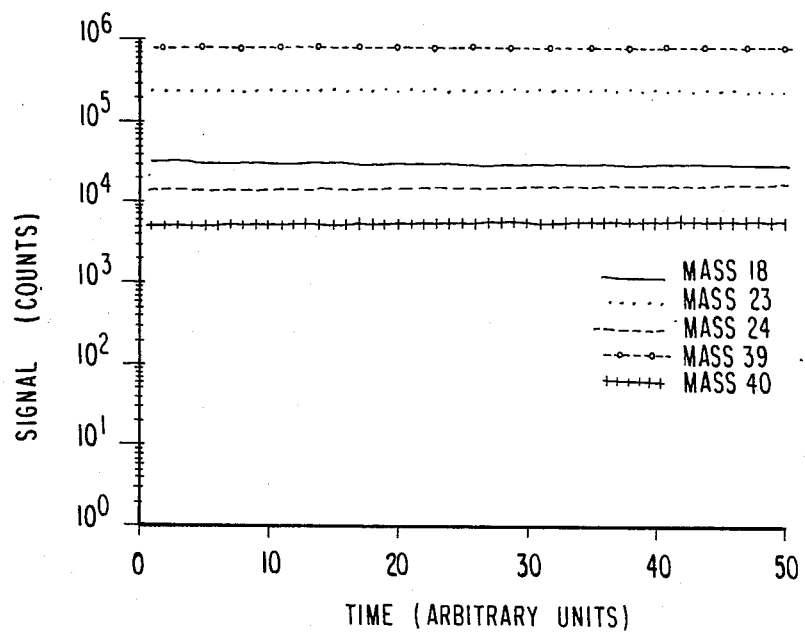
FIG. 7 — DEPTH PROFILE

CRYOGENIC SAMPLE STAGE FOR AN ION MICROSCOPE

This invention was made with Government support under OR1GM24314 awarded by the National Institute of Health. The Government has certain rights in this invention.

BACKGROUND OF THE INVENTION

This invention is related to a sample stage for use on an ion mass spectrometry system. In particular, this invention is directed to a cryogenic sample stage which allows the study of the true distribution of ions in biological systems using an ion microscope.

Ion microscopes based on the principle of secondary ion mass spectrometry ("SIMS") are known valuable systems used for studying elemental, that is isotopic, distribution in solid samples. The use of these devices is set forth in N. H. Turner et al, *Anal. Chem.* 56,373R (1984), and G. H. Morrison and G. Slodzian, *Anal. Chem.* 47,932A (1975). When employed in the nonimaging mode, such instruments have been used extensively in studies involving semiconductors, geologicals, and other nonhydrated specimens. The imaging mode has been recognized as offering great potential for biological studies in that the unique ion optics of the system allow direct microscopic imaging of ions in relation to cell morphology at high resolution. Typical lateral resolution is in the range of 0.5 $\mu$m.

In the study of various biological systems, it has been known that ions play a significant role in intracellular regulatory events. With the capability of ion imaging with cell morphology, the ion microscope, therefore, provides a powerful tool used in studies of the role and transport of ions under physiological, pathological and toxicological states in such biological systems. Given the promise of an ion microscope, however, there is a classical problem employed for ion microanalysis of biological samples; the items under test are hydrated. Such samples had to be sectioned and dehydrated before analysis due to the high vacuum requirements for the ion microscope.

Thus, conventional techniques of biological sample preparation such as fixation using chemical fixatives (gluteraldehyde, osmiumtetroxide, and the like) followed by dehydration with organic solvents (ethanol, acetone, and the like) and finally embedding using the plastic resins, suffer to various degrees from artifacts of relocation and the loss of diffusible elements from their native states during such processing.

Cryotechniques emerged as a choice for biological microanalysis. In the absence of a cold stage in the instrument, cryosectioning followed by freeze drying has been used. Freeze drying artifacts, however, cannot be evaluated in this technique of sample preparation. Thus, to study the true distribution and role of ions in biological systems with an ion microscope, it becomes essential to develop a sample stage with cryogenic capability that allows direct analysis of frozen-hydrated biological samples.

Within the prior art, one known technique has been attempted for the Cameca IMS-3f ion microanalyzer. This device is a version of SIMS instrumentation employing a set of ion optics to maintain spatial orientation of secondary ions which leave the sample surface after sputtering by the primary beam. The cold sample stage attempted for use on a IMS-3f ion microanalyzer employed a stage cooled by nitrogen gas which had in turn been cooled by passing in a bath of liquid nitrogen. This cooled gas then passed over a heating element where it was warmed slightly before flowing on the backside of sample holder mount. A thermocouple was used to measure the sample temperature and it was located inside a cold stem where the cold gas flowed passed it before being removed from the system. The sample was held in a standard sample holder having poor thermoconductivity. The thermocouple itself was a large heat sink due to the sample holder bellows in a relatively thick cup to the cold stem. Consequently, the measurements of temperature were at best an inaccurate assessment of the sample. Such is a severe limitation for use with biological samples and consequently this device was not commercially acceptable.

SUMMARY OF THE INVENTION

Given this deficiency, the need exists for a simple and inexpensive cold stage which can be used for an ion microscope to allow for analysis of frozen hydrated biological samples. The Cameca IMS-3f ion microanalyzer is an appropriate instrument upon which such a cold stage finds utilization. Thus, a direct image of the lateral elemental distribution of the sample surface is produced with a resolution range of approximately 0.5 $\mu$m. The sample to be analyzed is mounted on a stage in vacuum conditions, typically $10^{-7}-10^{-9}$ Torr with the sample situation in the sample chamber section of the ion microscope. For biological work, the thin sections of tissue are mounted on a conducting wafer which in turn is mounted in the conventional sample holder and held in place by a spring.

FIG. 1 illustrates the essential features of a standard commercial sample stage. A sample holder 10 and a sample holder mount 12 are placed on a sample stem 14. The sample holder 10 comprises a stainless steel piece serving as a holder for specimens to be analyzed. The sample holder 10 facilitates a mechanical transfer of samples to the sample chamber where it slides onto the mount 12.

The sample holder mount 12 is also a stainless piece that holds the sample holder 10 during analysis. The mount is fixed to the sample stem 14 which in turn is attached to a back plate 18 of the sample chamber door 20. The sample stem 14 employs a ceramic insulator 22 which serves to electrically isolate the sample from ground.

FIG. 1 illustrates the sample bias at approximately ±4500 volts with respect to ground depending on the desired polarity of the secondary ions.

The sample chamber door backplate 18 employs verniers to alter the lateral, that is X and Y positions of the sample stage vis-a-vis the ion microscope.

To change samples in this system, the sample holder 10 is brought to specific extraction coordinates which are within the working distance of the sample changing arm mechanism, not illustrated. The sample is held at a fixed Z-coordinate of approximately 4.5 mm from and parallel to an immersion lens 24. This is the first lens as a secondary optics which the sample faces. This Z-coordinate is critical for optimum secondary ion optical transmission since it defines the accelerating region for the ion. FIG.1 also illustrates schematically direction of impingement of the primary beam and of the path of secondary ions to the mass spectrometer.

In this conventional device, the cold stage must preserve fine mechanical alignment of the stage with respect to the immersion lens 24, thus allowing correct secondary ion optical parameters as required by the system. Moreover, the cold stage must enable the ±4500 volts potential to be maintained at the sample holder 10 while all components outside of the vacuum and in contact with the body of the instrument remain at ground potential. Importantly, sample temperatures must be maintained at below minus 150° C. during analysis with this temperature maintained with minimum fluctuations and without altering the normal operation of the ion microscope system.

This invention overcomes the objects of the prior art by providing a technique for circulating a cooling fluid into a direct heat transfer relationship with the sample mount. In order to orient the cold stages vis-a-vis the immersion lens, a bellows and adjustment mechanism is provided for Z-axis movement of the cold stage. Additionally, direct temperature measurements are possible by mounting a sensor in direct proximity to the sample under investigation.

BRIEF DESCRIPTION OF THE DRAWINGS

FIG. 1 is a schematic view of a sample stage system in accordance with the prior art;

FIG. 2 is a pictorial representation of a thermodynamic model describing the action of heat flow in a solid cylinder.

FIG. 5 illustrates curves showing cool-down of the cold stage in accordance with this invention;

FIG. 6 is a pictorial representation of the mass spectrum obtained for a frozen hydrated sample of a chick intestine cryosection;

FIG. 7 is an in-depth profile monitoring secondary ion intensities with time of water for the frozen hydrated chick intestine cryosection.

DESCRIPTION OF THE PREFERRED EMBODIMENT

Figure 3:
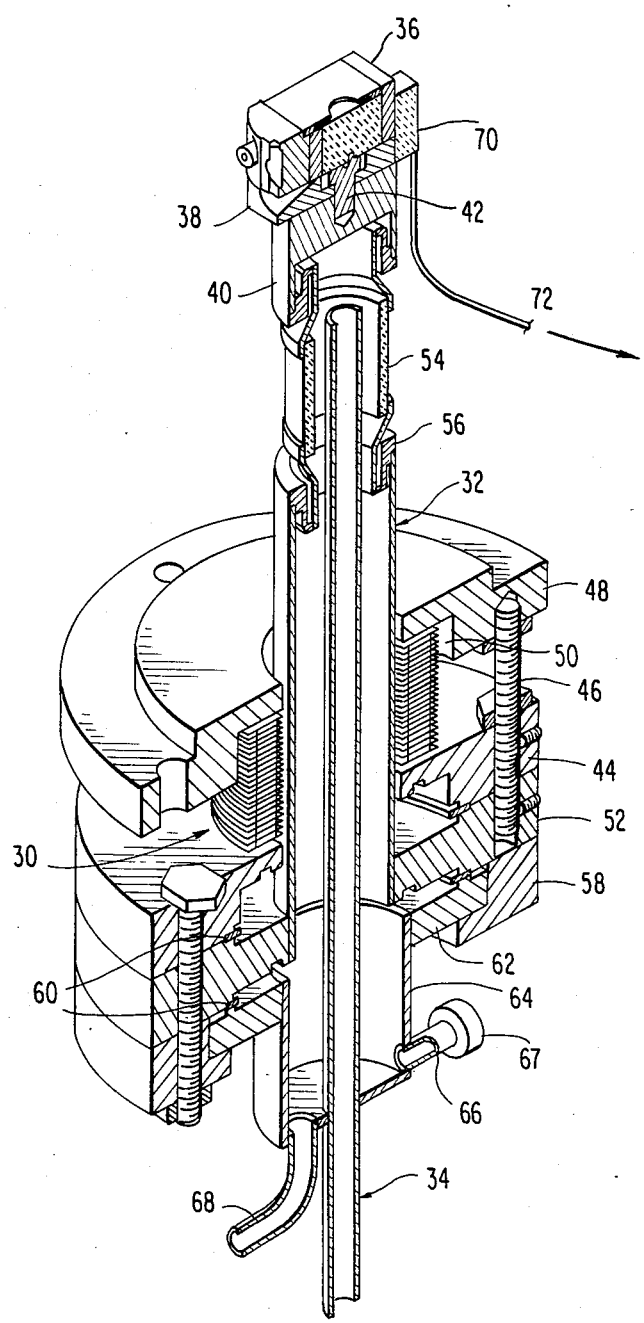
FIG. 3 is an isometric sectional diagram of the cold stage in accordance with a preferred embodiment of this invention.

In accordance with this invention, a determination is necessary to determine the amount of power required to be dissipated to avoid heating a sample if analysis at a third parameter is to be conducted. It was calculated that approximately 3 mW (milliwatts) of power were required to be dissipated in an optimized cold stage to avoid heating of the sample under analysis with an $O_2$ primary beam of 500 nA (nanoamps) at 5.5 kV (kilovolts) having a spot size of 75 $\mu$m (micrometers) diameter. In order to insure that the sample would maintain a satisfactory low temperature under ion bombardment, the cold stage parameters must therefore first be calculated. The following model was generated to establish the appropriate geometry and materials for the cold stage system. Referring to FIG. 2, the sample at a temperature $T_1$ has a load of 3 mW and is placed on a cylindrical stage of length L which transmits heat by thermal conduction to a point where it can be cooled. The sample and the stage are surrounded by the remainder of the instrument which is maintained at ambient temperature ($T_w = 300°$) which transfers heat by thermal radiation to the cool system. The surrounding instrument is denoted schematically as the wall in FIG. 2. Utilizing basic thermodynamic principles, the heat flow due to conduction in the cylinder and the radiation from the surrounding wall can be determined. The heat flowing in the length segment dz of the cylinder can be described by:

$$\dot{Q}_{in} = KA \frac{dT}{dz}\bigg|_z + \sigma \epsilon A(T_w^4 - T^4) \quad (1)$$

and the heat flowing out can be expressed by:

$$\dot{Q}_{out} = KA \frac{dT}{dz}\bigg|_{(z+dz)} \quad (2)$$

where $\sigma$ is the Stefan-Boltzman constant, $\epsilon$ is the emissivity of the surface and K is the thermal conductivity of the cylinder material.

For steady state conditions, $\dot{Q}_{in}$ with $\dot{Q}_{out}$ can be equated and by use of the definition of the second derivative to reduce the problem to a second order differential equation the following results:

$$\frac{d^2(T_w - T)}{dz^2} - \xi^2 (T_w - T) = 0 \quad (3)$$

where $$\xi^2 = \frac{2\sigma\epsilon}{KR} T_w^3 \left[ 1 + \frac{T}{T_w} + \left(\frac{T}{T_w}\right)^2 + \left(\frac{T}{T_w}\right)^3 \right] \quad (4)$$

If it is now assumed that $\xi^2$ is reasonably constant between $T_1$ and $T_2$, then equation 4 is linear and a solution can be defined:

$$(T_w - T) = C_1 \cos \xi z + C_2 \sin \xi z \quad (5)$$

Applying the boundary conditions (i) at $z=0$ where $\dot{Q}_{in} = 3$ mW and $T = T_1$, and (ii) at $z = L$ where $T_2$ is fixed, the following values for the constants $C_1$ and $C_2$ can be determined:

$$C_1 = \frac{(T_w - T_2) + \frac{\dot{Q}_{in}}{K\xi A} \sin \xi L}{\cos \xi L} \quad (6)$$

and $$C_2 = -\frac{\dot{Q}_{in}}{K\xi A} \quad (7)$$

The sample temperature under analysis can then described by the following equation.

$$T_1 = T_w - \left\{ \frac{(T_w - T_2) + \frac{\dot{Q}_{in}}{K\xi A} \sin \xi L}{\cos \xi L} \right\} \quad (8)$$

Given the results obtained from equation (8), it was decided to use a gold plated copper cylinder of approximately 2.5 cm in diameter and direct liquid nitrogen cooling at temperature $T_2$. Then, $\xi$ approximately equals 0.1. With a cylinder length L of 2.5 cm the sample temperature $T_1$ is approximately equal to 77° K. (−196° C.). It should be noted that the model shown in FIG. 2 does not take into account the thermal resistance due to the junctions of the sample holder mount to its copper base and the sample holder to the mount. It also does not take into consideration paths of dissimilar metals, although such analysis is easily made.

Given the results from the model, the preferred embodiments of the cold stage as illustrated in FIG. 3 was developed. There are three subcomponents of this device. The first is the bellows 30 which with other components is used for Z-axis adjustment. The second subcomponent is the cold stem 32 and the third, a liquid nitrogen feedthrough illustrated schematically as 34 with associated components.

Figure 4:
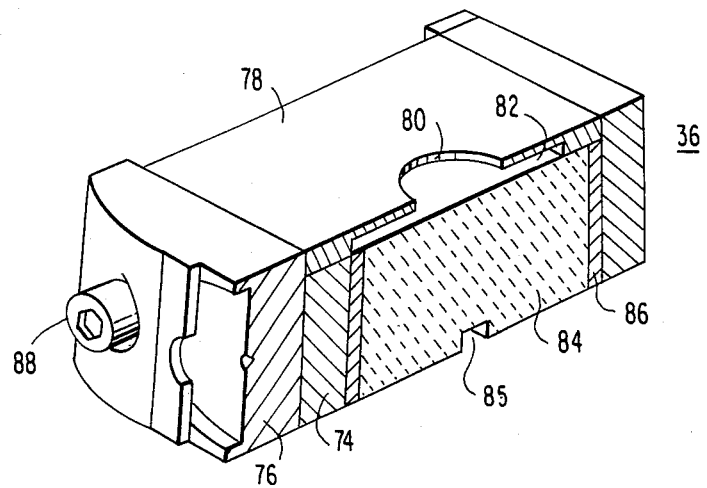
FIG. 4 is an isometric section drawing of the sample holder used in the cold stage of this invention.
Figure 4:
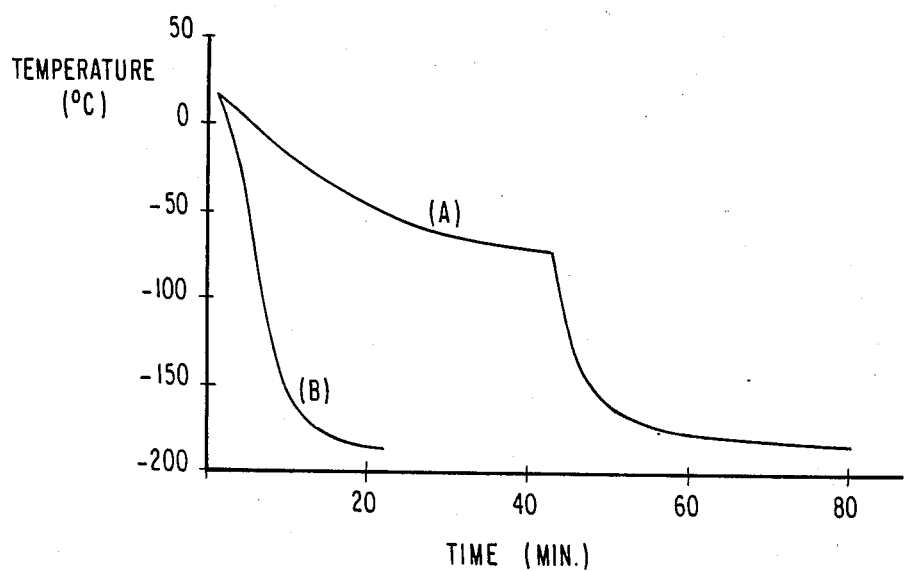

FIG. 3 illustrates a sample holder 36 to be discussed herein relative to FIG. 4 coupled to a sample holder mount 38. The cold stem 32 employs a copper top 40 having a flanged portion and a solid copper mass top portion. The sample holder mount 38 is bolted by means of bolt 42 flush to the copper top 40 of the cold stem to provide good thermal contact. The sample holder mount 38 is itself made of stainless steel for improved durability. As illustrated, a recess is provided for the bolt head to insure a flush finish.

Given the fact that the sample holder mount 38 cannot be adjusted, a bellows assembly is necessary to enable the sample holder to fit to a particular instrument and allow movement of the stage in the Z direction. The bellows assembly comprises a bellows flange 48 made of stainless steel which mounts on the sample door (see FIG. 1) and employs a series of four Z-adjustment screws 46. These are typically ¼-28 threaded rods with nut adjusters, it being understood that any suitable Z-axis adjustment technique may be employed. The screws 46 are embedded into another flange 44. The bellows 30 is welded to the flange 44 and is disposed within a recess 50 formed in the flange 48. The flange 48 is in turn welded to the bellows 30. By adjustment the four nuts, on the threaded rods 46, mechanical adjustment of the sample holder mount can be accomplished outside of the vacuum conditions.

The cold stem 32 comprises a stainless steel tube welded to a conflat flange 52. At the upper end of the tube 32, a ceramic vacuum break 54 is positioned and interposed between the tube 32 and the copper top 40. The ceramic break may be made using material from Ceramaseal Inc. in New Lebanon Center, N.Y. The copper top is soldered to the ceramic vacuum break at 54. The cold stem 32 carries at its upper portion a second copper top 56 having a U-flanged portion to allow for thermal expansion and contraction. The copper top 56 is in turn soldered to the ceramic break 54. Thus, as illustrated in FIG. 3 between the ceramic break 54 is interposed between two expansion joints to allow for thermal stresses which exist within the system.

To provide for a vacuum fit between the flange 44 and the cold stem flange 52 and, of course, finally between the cold stem flange 52 and a liquid nitrogen port flange 58, a pair of copper gaskets 60 are interposed. These gaskets provide the necessary vacuum fit between those three metallic elements.

The liquid nitrogen feedthrough 34 comprises a rotatable conflat flange 58 having an inwardly protruding plate 62 and rotatable cylindrical portion 64. As illustrated in FIG. 3, the inlet tube 34 runs vertically through the device about its central axis and terminates in an upper portion near the back of the copper top 40 of the cold stage. Nitrogen is supplied through an entry at the lower portion and flows through the tube assembly of the sample stem which is in contact with the backside of the copper top. The liquid nitrogen then exists through the passageway formed between the inner wall ceramic block 54 and the tube 34, into the passageway formed between the tube 32 and the tube 34 and through an outlet 68 placed on the lower portion of the rotatable section 64. A liquid nitrogen drain 66 is also provided having a valve 67. Thus, liquid nitrogen fills the cavity, that is, within the chambers formed by elements 32, 54, and 64 circulates and is maintained in a sealed relationship by means of the copper gaskets 60. By continuous contact with the copper top 40, cooling to the sample mount is achieved. All copper pieces are gold plated to reduce oxidation.

A thermistor 70 is placed in an overlapping relationship between the sample holder mount 36 and the sample holder mount 38 with the necessary electrical connection 72 passing out of the bellows assembly via an electrical feedthrough. The thermistor may be a platinum RTD temperature sensor manufactured by Omega Engineering, Inc., Stamford, Conn., and employs a digital temperature monitor readout (not illustrated).

Referring now to FIG. 4, the sample holder 36 will be described in greater detail. The sample holder comprises the gold plated copper block 74 serving as a thermal reservoir during sample transfer and is a good conductor for cryogenic operation. The copper block is then fitted to a stainless steel frame 76 which provides mechanical strength and an effective thermal barrier when used with an appropriate transfer mechanism which must come in contact with it. The sample holder 36 has a stainless steel top 78 with a through-hole 80. Stainless steel top 78 has a recessed portion 82 to accommodate the sample. A polish silicon disk 84 is the surface upon which the sample rests. The disk is held in place by means of a gold plated copper cylinder 86 having a machined slot 85, to allow a screwing of the bolt 42 to be flush with the copper top of the cold stem. A screw 88 is used for locking the copper block 74 onto the stainless steel frame 76. Heat is therefore transferred by conduction through the body of the sample holder 36 and its mount 38 to the copper top 40 of the sample stem 32 which is in contact with liquid nitrogen flowing through the system from stem 34.

In operation of the cold stage illustrated in FIG. 3 is attached to the sample chamber door 20 and the stage is adjusted to the correct distance from and parallel to the emerging lens 24 (see FIG. 1). A high voltage lead supplying the secondary accelerating voltage is then connected to the sample holder mount by a spring not illustrated. The sample chamber door 20 is closed in the unit evacuated.

The cold stage can be cooled using two methods. The first is a precooling method which minimizes thermal shocks to the ceramic insulator 54. The second is by direct liquid nitrogen cooling. Precooling is preferred and is achieved by passing helium gas at low throughput through a coil made of a 100 feet of ¼ inch copper tubing which is placed in a dewar of liquid nitrogen. After a sufficient cooling period, the cool helium arrangement is replaced with liquid nitrogen which is gravity fed from the deway reservoir and hose arrangement. Referring to FIG. 5 cool-down curves are indicated where indirect liquid nitrogen cooling was utilized to test overall durability of this system. The cool-down curve (A) shown in FIG. 5 corresponds to the precooling period wherein the first time segment to approximately 45 minutes is the precooling of the shell or temperature reduction slope. Curve (B) and the extension of curve (A) represents direct liquid nitrogen cooling to approximately the final operating temperature of $-182°$ C. As illustrated in FIG. 5, irrespective of which method is used, this final operating temperature can be obtained in a reasonable manner with no noticeable fluctuations so long as liquid nitrogen is supplied to the system.

When the operation is complete, the drain valve 66 on the drain line is open to permit rapid removal of liquid nitrogen.

EXAMPLE

An example is presented of a test of the feasibility of the cryogenic sample stage in accordance with this invention using a Cameca IMS-3f ion microscope. First, a standard instrument alignment procedure was undertaken. A copper grid pressed on an aluminum substrate was used to align the primary and secondary ion optics of the instruments at the operating temperature of $-182°$ C. Utilizing standard techniques, the $Al^+$ (mass 27) ion image of the copper grid was optically reviewed and no obvious distortion was detected. The copper grid tested was then replaced by a biological specimen, in this case, 2 $\mu$m frozen hydrated cryosection of a chick intestine. The mass spectrum of this specimen indicates the presence of physiologically important diffusible elements such as $Na^+$, $K^+$, $Ca^+$ and the like. The signal for $H_2O^+$ at mass 18 was also observed. FIG. 6 is a mass spectrum chart of the frozen hydrated section showing those physiologically important diffusible elements observed in this test. The potassium ion micrograph (not illustrated) illustrated the distribution of potassium in the intestinal villi. In that photograph intervillous spaces were clearly illustrated and were devoid of potassium. Within a villus, surface epithelium illustrated slightly higher potassium intensities. Images of $Na^+$, $Ca^+$ and $Mg^+$ were also recorded in different distributions observed.

To confirm that the specimen remained frozen and hydrated during analysis, in-depth profiling of elements of interest was monitored for 15 minutes of analysis. This is illustrated in FIG. 7. As illustrated in that figure, there was no significant decline in the water signal over a period of 15 minutes indicating a minimum freeze drying effect of the specimen due to primary beam heating during analysis. As illustrated in FIG. 7, it is interesting to note that in such real life situations, the concentrations of these elements in most biological systems are in a decreasing order of potassium, sodium, magnesium and calcium.

As demonstrated by this example, the cold stage of this invention provides an improved thermal conducting path behind the sample, therefore, providing an improved path for heat removal from the sample. Given the fact that the thermistor 70 is provided as close to the sample surface as possible, quick and accurate responses to changes in sample temperature may be observed. This is in contrast to prior art techniques where thermocouples were used to measure the sample temperature and were located inside the cold stem, that is the position where the cooled gas flows pass the temperature sensor prior to removal from the system. Such a temperature measurement was an inadequate assessment of the temperature of the sample and the severe limitation for use with biological samples. Thus, improved temperature stability is achived with this invention.

It is apparent that modifications to this system may be made without departing from the essential novelty thereof. Thus, for example, while FIG. 3 illustrates various liquid nitrogen feedthroughs and the like, other arrangements can be employed so long as liquid nitrogen is fed to the top of the cold stage such that it exists fairly close to the copper block 40. Additionally, different liquid measuring feedthrough systems can be used to reduce coil/concentration stresses on the copper vacuum gasket 60, generally, by reducing the size of the liquid nitrogen port flange 58.

Additionally, the geometry of the copper top may be modified to reduce residual gas pressures which may interfere with ultimate sensitivity when the gas is absorbed on the cold surface and remain there. For example, a deposition of activated charcoal or alumina which increases the cold surface area thus absorbing by cryogenic action residual water vapor and the like may be employed.

We claim:

1. A cryogenic sample stage for an ion microscope having a lens system with an ion emission-immersion lens to form an image of a sample under study comprising:

a mounting section for a sample under study, means coupled to and providing a cooling fluid to said mounting section; and means to adjust the position of said mounting section relative to said ion emission-immersion lens of said microscope lens system.

2. The apparatus of claim 1 wherein said mounting system comprises a sample holder mount coupled to said means to provide a cooling fluid, a sample holder mounted to said sample holder mount, and a temperature sensor attached to said sample holder.

3. The apparatus of claim 2 wherein said sample holder comprises a stainless steel frame, a copper body mounted in said frame serving as a thermal reservoir and a semiconductor plate having surface receiving a sample.

4. The apparatus of claim 3 wherein said semiconductor plate is mounted on a metallic cylinder, said metallic cylinder having means to removably mount to said copper body.

5. The apparatus of claim 2 wherein said means to provide a cooling fluid comprises a thermally conductive mass and means to fix said sample holder mount to said thermally conductive mass.

6. The apparatus of claim 1, wherein said means to provide a cooling fluid comprises a source of cooling fluid, a feedtube coupled at one end to said source, and having a cooling chamber at the other end to circulate cooling fluid in a thermally conductive manner to said mounting section.

7. The apparatus of claim 6 wherein said means to supply a cooling fluid further comprising first outer sleeve concentric with said feedtube, said outer sleeve coupled to said means to adjust the position of said mounting section and an insulator coupling said outer sleeve to said mounting section, whereby cooling fluid passes from said feedtube with said cooling chamber and then into an annular space between said feedtube and said first outer sleeve for removal.

8. The apparatus of claim 7 wherein said means to supply a cooling fluid further comprises a second outer sleeve concentric with said feedtube and rotatable relative to it and, means coupled to said second outer sleeve to exhaust said cooling liquid from said annular space.

9. The apparatus of claim 7 wherein said means to adjust the position of said mounting section comprises a first flange coupled to said first outer sleeve, a bellows flange, a bellows coupled to both said first flange and said bellows flange, a mounting flange and adjustment means mounted on said bellows flange to move said first flange and said bellows flange relative to said mounting flange.

10. The apparatus of claim 9 wherein said adjustment means comprises an adjustment screw and a nut mounted on said bellows flange, said adjustment screw having one end adapted to abut against said mounting flange and fixed to said first flange at an opposite end.

11. The apparatus of claim 1 wherein said means to adjust the position of said mounting section comprises a first flange coupled to said means to provide a coupling fluid and second flange for mounting said sample stage to said microscope and means for carrying the distance between said first and second flanges.

12. The apparatus of claim 1 further comprises a thermistor coupled to said mounting section to measure the temperature thereof.

13. The apparatus of claim 1 wherein said means coupled to and providing a cooling fluid thermistor at one end with an expansion joint, and a ceramic insulator coupled to said expansion joint.

14. The apparatus of claim 13 wherein said mounting section comprises an expansion joint coupled to said ceramic insulator.

* * * * *